(12) United States Patent
Holbrook et al.

(10) Patent No.: US 8,480,419 B2
(45) Date of Patent: Jul. 9, 2013

(54) LOW INDUCTANCE CONNECTOR ASSEMBLY

(75) Inventors: Meghan Ann Holbrook, Manhattan Beach, CA (US); Douglas S. Carlson, Hawthorne, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 634 days.

(21) Appl. No.: 12/348,928

(22) Filed: Jan. 6, 2009

(65) Prior Publication Data

US 2010/0173509 A1    Jul. 8, 2010

(51) Int. Cl.
*H01R 4/60* (2006.01)

(52) U.S. Cl.
USPC .......................................... 439/213; 174/72 B

(58) Field of Classification Search
USPC ................. 439/213, 212, 210, 207; 361/648, 361/650, 624, 355, 637; 174/68.2, 72 B, 174/71 B, 88 B, 70 B, 99 B, 129 B, 133 B, 174/149 B
See application file for complete search history.

(56) References Cited

U.S. PATENT DOCUMENTS

| 4,867,696 A | * | 9/1989 | Demler et al. | 439/212 |
| 6,024,589 A | * | 2/2000 | Hahn et al. | 439/212 |
| 6,629,854 B2 | * | 10/2003 | Murakami | 439/212 |

FOREIGN PATENT DOCUMENTS

EP    1174992 A2    1/2002

OTHER PUBLICATIONS

German Office Action, dated Nov. 12, 2012, for German Patent Application No. 10 2009 040 523.5.

* cited by examiner

*Primary Examiner* — Felix O Figueroa
(74) *Attorney, Agent, or Firm* — Ingrassia Fisher & Lorenz, P.C.

(57) ABSTRACT

A busbar connector assembly for coupling first and second terminals on a two-terminal device to first and second contacts on a power module is provided. The first terminal resides proximate the first contact and the second terminal resides proximate the second contact. The assembly comprises a first bridge having a first end configured to be electrically coupled to the first terminal, and a second end configured to be electrically coupled to the second contact, and a second bridge substantially overlapping the first bridge and having a first end electrically coupled to the first contact, and a second end electrically coupled to the second terminal.

5 Claims, 3 Drawing Sheets

LOW INDUCTANCE CONNECTOR ASSEMBLY

STATEMENT REGARDING FEDERALLY SPONSORED RESEARCH OR DEVELOPMENT

This invention was made with Government support under DE-FC26-07NT43123 awarded by US-Department of Energy. The Government has certain rights in this invention.

TECHNICAL FIELD

The present invention generally relates to automotive busbar systems, and more particularly relates to low inductance connector assemblies for an automotive busbar system.

BACKGROUND OF THE INVENTION

Electric and hybrid electric vehicles often use sources of high voltage such as battery packs or fuel cells that deliver direct current (DC) to drive vehicle motors, electric traction systems, and other vehicle systems. These systems typically include power inverters to convert DC input from the power source to a 3-phase alternating current (AC) output compatible with electric motors and other electrical components. Such inverters generally include both power and capacitor modules interconnected by a busbar system that distributes current throughout the inverter. Such busbar systems often involve two or more intricately designed laminar positive and negative electrodes that overlap for most of the area of the busbar.

Moreover, some conventional inverters have been observed to incur voltage spikes when currents flowing through the power module abruptly change, such as when the inverter is switched on or off. The magnitudes of these voltage spikes are related, at least in part, to the inductance of the busbar. More particularly, the relationship between inductance (L), current (i), voltage (V), and time (t) is described in equation (1):

$$V = L * (di/dt) \qquad (1)$$

This equation demonstrates that voltage spikes are intensified for systems that have a high inherent inductance. That is, even relatively small changes in current can produce relatively large voltage spikes if the inductance is high. A busbar may contribute substantially to the total inductance of an inverter system because of the relatively long current pathway between its various input and output terminals.

Many busbar design factors such as the amount of overlap between positive and negative electrodes can affect the inductance of a busbar system. Because current flows in opposing directions in each electrode, this overlap effectively reduces the overall system inductance. While laminar designs offer an overlapped current pathway for the majority of area, the interconnecting elements that transfer current from a primary busbar to a subsystem receiving the current, such as a power module, have non-overlapping connector assemblies. Accordingly, the contribution of such assemblies to overall system inductance can be significant.

Accordingly, it is desirable to provide a low inductance connector assembly for a busbar system to reduce voltage spikes when power modules are switched on or off. Further, it is also desirable if such a connector assembly has a reduced material cost and part count, and is simpler to assemble. Furthermore, other desirable features and characteristics of the present invention will become apparent from the subsequent detailed description and the appended claims, taken in conjunction with the accompanying drawings and the foregoing technical field and background.

SUMMARY OF THE INVENTION

According to various embodiments, a busbar connector assembly for coupling first and second terminals on a two-terminal device to first and second contacts on a power module is provided. The first terminal resides proximate the first contact and the second terminal resides proximate the second contact. The assembly comprises a first bridge having a first end configured to be electrically coupled to the first terminal, and a second end configured to be electrically coupled to the second contact, and a second bridge substantially overlapping the first bridge and having a first end electrically coupled to the first contact, and a second end electrically coupled to the second terminal.

DESCRIPTION OF THE DRAWINGS

The present invention will hereinafter be described in conjunction with the following drawing figures, wherein like numerals denote like elements, and.

DESCRIPTION OF AN EXEMPLARY EMBODIMENT

The various embodiments of the present invention described herein provide a connector assembly for a busbar system having a reduced inductance. The connector assembly includes two overlapping, conductive, and electrically isolated bridge electrodes, each electrode configured to electrically couple a positive or negative electrode of a primary busbar assembly with a power module input contact. Each bridge electrode forms a conductive pathway between these points that substantially overlaps and crosses with the pathway formed by the other bridge electrode. Further, each bridge electrode is configured with a connecting tab that overlaps with both positive and negative electrodes of the primary busbar assembly in the region where the tab is fastened. The contribution to busbar system inductance from the connector assembly is reduced as a result of the increased area of overlap of the primary busbar and bridge electrodes and the crossed current pathways this configuration provides.

Figure 1:
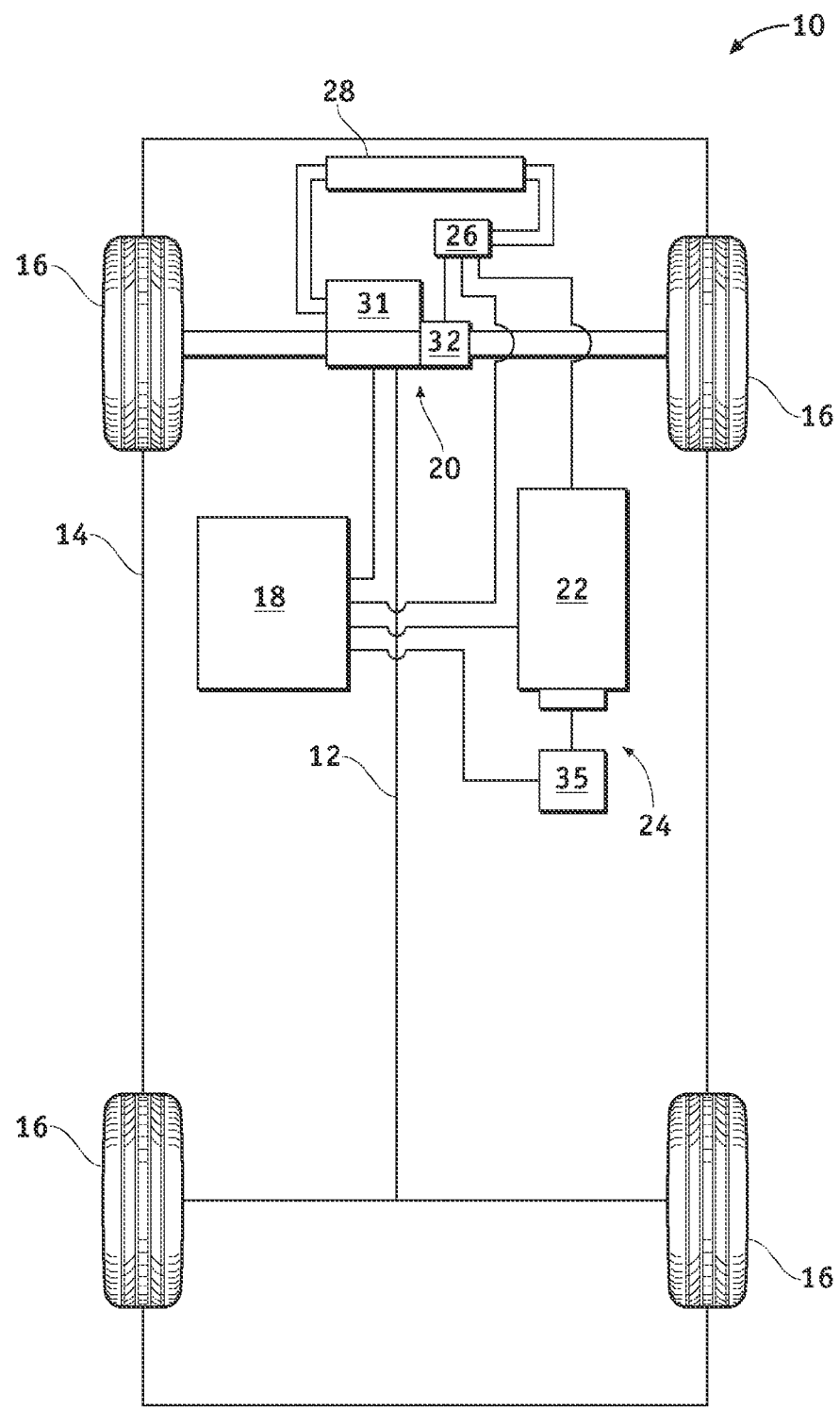
FIG. 1 is a schematic view of an exemplary vehicle illustrating the manner in which a power inverter having an exemplary connector assembly is integrated with various sub-components of the vehicle.

FIG. 1 illustrates a vehicle 10, such as an automobile according to one embodiment of the present invention. Vehicle 10 includes a chassis 12, a body 14, four wheels 16, and an electronic control system (or electronic control unit (ECU)) 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

Vehicle 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). Vehicle 10 may also incorporate any one of, or combination of, a number of different types of engines (or actuators), such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, or a fuel cell, a combustion/electric motor hybrid engine, and an electric motor.

In the exemplary embodiment illustrated in FIG. 1, vehicle 10 is a hybrid vehicle that further includes an actuator assembly (or powertrain) 20, a battery 22, a battery state of charge (SOC) system 24, a power inverter assembly 26, a state of charge (SOC) module 35, and a radiator 28. The actuator assembly 20 suitably includes an internal combustion engine 31 and an electric motor/generator (or motor) system (or assembly) 32. The battery 22 is electrically connected to the power inverter assembly 26 and, in one embodiment, is a lithium ion (Li-ion) battery including any number of cells, as is commonly understood.

Typically, a power inverter includes a power busbar assembly that has at least one busbar for providing a conductive pathway for current flow between associated electronic components such as a DC source, a capacitor assembly including a capacitor busbar assembly, and a power module assembly. Power and capacitor busbar assemblies typically have a laminar structure or the like that includes overlapping positive and negative electrically conducting outer electrode layers or busbars that are insulated from each other by a non-conducting central layer. These busbar assemblies may be configured as desired to compactly fit between capacitor and power module assemblies and to shorten the current pathway between these components to minimize the overall system inductance.

Figure 2:
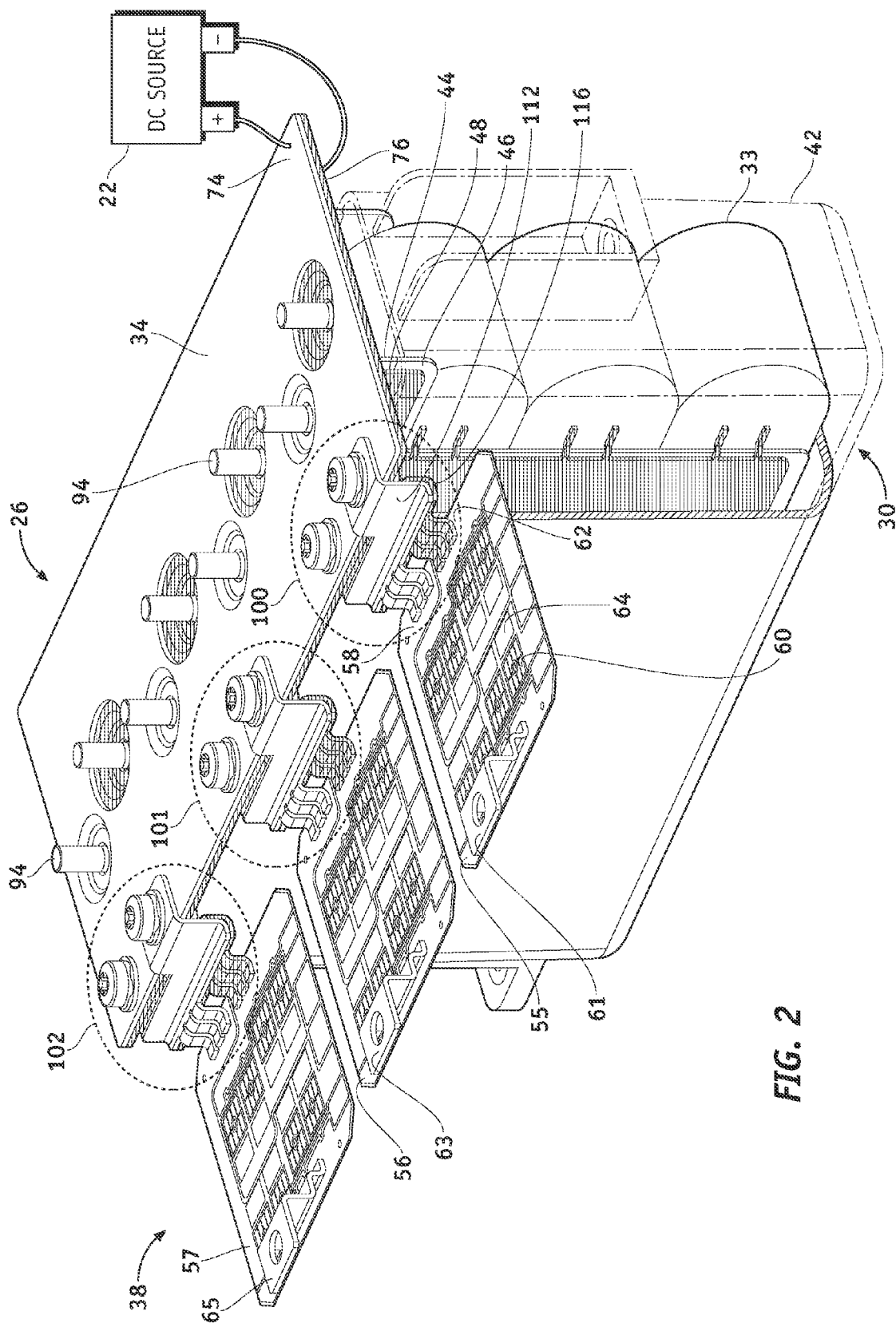
FIG. 2 is an isometric view of the vehicular power inverter assembly depicted in FIG. 1 having a low inductance connector assembly in accordance with an exemplary embodiment.

FIG. 2 is a schematic drawing illustrating selected components of power inverter assembly 26 for use in vehicle 10 shown in FIG. 1 in accordance with a first exemplary embodiment. Power inverter assembly 26 includes a capacitor assembly 30, a power module assembly 38, and a power busbar assembly 34 that electrically couples these modules together by providing a conductive path between their various input and/or output terminals. Capacitor assembly 30 is a bipolar or two-terminal (positive and negative terminal) device, and may include an array of any number of individual bipolar capacitors 33 (or capacitor bobbins), contained within a housing 42. Housing 42 may be constructed of any durable and electrically insulating material which provides capacitors and associated electrical connections protection from road debris and environmental ingressions. Capacitor assembly 30 also includes a U-shaped capacitor busbar assembly 46 formed as a laminar structure that has a first positive busbar 44 and a first negative busbar 48. These busbars together straddle the capacitor array of assembly 30 providing electrical coupling to positive and negative terminals, respectively, of individual capacitors 33 therein.

Power busbar assembly 34 has a laminar and substantially planar structure and includes a second positive busbar 74 overlapping with a second negative busbar 76. Positive and negative busbars of power and capacitor busbar assemblies 34 and 46 each comprise a layer of a conducting material such as, for example, copper or tin-plated copper, each busbar layer electrically isolated from the other busbar by an interposed insulating layer. Together, the two busbar layers, in conjunction with the insulating layer, form a laminar structure for each assembly. Second positive and negative busbars 74 and 76 are coupled in electrical continuity with first positive and negative busbars 44 and 48, respectively, using a plurality of electrically conductive threaded studs 94 that, when tightened with an associated conductive nut (not shown), also mechanically clamp busbar assemblies 34 and 46 together. Each individual stud provides a conductive pathway between busbars of one polarity, but is isolated from the opposite polarity to avoid electrical shorting. Second positive and negative busbars 74 and 76, respectively, may also be coupled to the terminals of a second two-terminal device such as, for example, a DC source battery 22. Battery 22 provides a DC voltage bias via electrical coupling with power busbar assembly 34 that is transferred to other interconnected two-terminal devices such as capacitor assembly 30 and power module assembly 38.

Power module assembly 38 may have any number of individual power modules, each module configured with two input terminals for receiving a DC input signal, and a single output terminal for providing a single-phase AC output signal. Assembly 38 may thereby provide a multi-phase AC output depending upon the number of individual power modules used. As shown in FIG. 2, power module assembly 38 comprises three power modules 55-57, each module electrically coupled to power busbar assembly 34 using connector assemblies 100-102, respectively, to be described in further detail below. Power modules 55-57 are each populated with a plurality of semiconductor-based power diode and switching devices including at least one IGBT (Insulated Gate Bipolar Transistor) 60 coupled to at least one accompanying power diode 64. Each power module converts a DC input signal received through an associated connector assembly to a single-phase, AC output signal that may be phase-adjusted so that, as shown, the combined output of modules 55-57 may comprise three complimentary AC phases.

Each of connector assemblies 100-102 is electrically coupled to power busbar assembly 34 and is configured to provide electrically separate conductive pathways between second positive and negative busbars 74 and 76 and input contacts of like polarity on an associated power module. Because the electrical and mechanical integration is the same for each connector assembly/power module pairing, only the integration between power module 55 and connector assembly 100 will be described in detail. Referring to FIG. 2, a DC input bias originating from DC battery 22 and modifiable by an output signal from capacitor assembly 30, is transferred through second positive and negative busbars 74 and 76 and connector assembly 100 to power module 55. Connector assembly 100 electrically couples second busbars 74 and 76 to input contacts 58 and 62, respectively, of module 55 using electrically isolated bridge electrodes 112 and 116. During operation, power module 55 generates a single-phase AC output transferable through an output contact 61. These signals are combined with similar signals from output contacts 63 and 65 of power modules 56 and 57, respectively, to provide 3-phase AC power.

Figure 3:
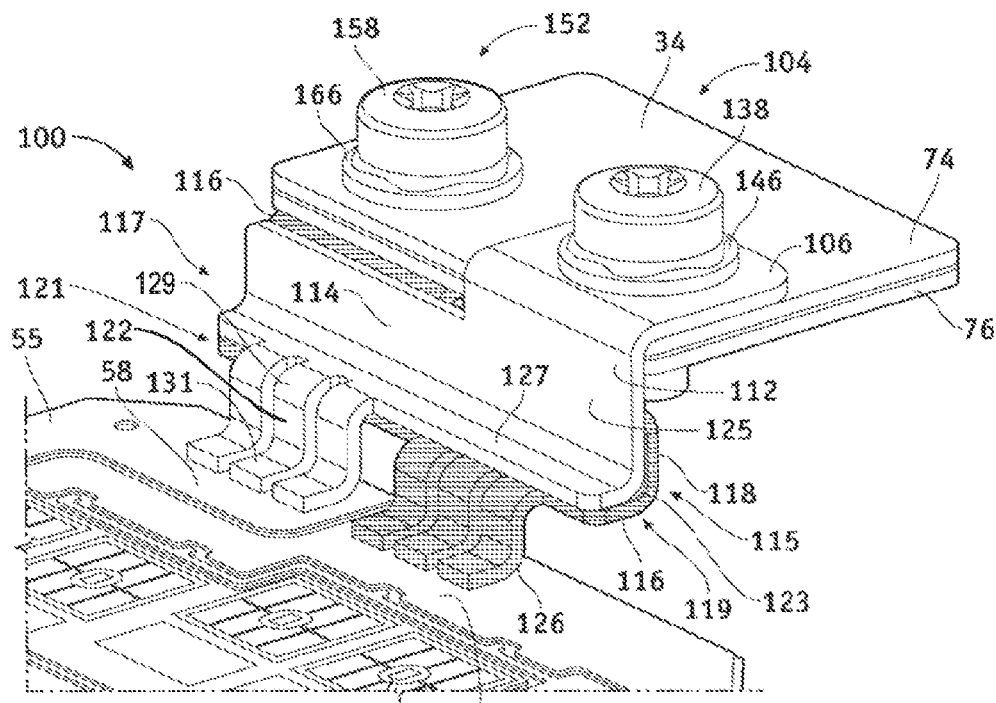
FIG. 3 is an isometric view of an exemplary connector assembly for use with the power inverter assembly depicted in FIG. 2.

FIG. 3 is an isometric diagram illustrating a manner in which connector assembly 100 is integrated between second positive and negative busbars 74 and 76 and power module 55 in accordance with the exemplary embodiment. Connector assembly 100 includes bridge electrode 112 coupled between second positive busbar 74 and input contact 58 of power module 55, and bridge electrode 116 coupled similarly between second negative busbar 76 and input contact 62. Bridge electrodes are also constructed from an electrically conductive material such as, for example, copper or tin-plated copper, and are electrically isolated from each other by a central insulating layer 123. Insulating layer 123 may be constructed of any suitable non-conducting material such as, for example, a powder coating or a sheet insulator such as Mylar®. At least a portion of the surface of bridge electrodes may also be coated or overlaid with such an insulating coating as necessary to prevent shorting.

Bridge electrode 112 has a first end 115 and a second end 117, and includes a connecting tab 106 proximate to first end 115 coupled to an end terminal 122 proximate second end 117 via a center section 114 that spans from first end 115 to second end 117. In one embodiment, connecting tab 106 and end terminal 122 are each integrally formed with center section 114 to form a single piece. In another embodiment, center section 114 has a first portion 125 integrally formed with and substantially perpendicular to a second portion 127. In yet another embodiment, connecting tab 106 is substantially perpendicular to first portion 125 of center section 114. In still another embodiment, second portion 127 is substantially parallel to connecting tab 106, and second portion 127 and connecting tab 106 are separated from each other by first portion 125. In a further embodiment, end terminal 122 includes a third portion 129 integrally formed with and substantially perpendicular to a fourth portion 131. Fourth portion 131 is electrically coupled with input contact 58 using any suitable method that provides electrical continuity such as by soldering or ultrasonic welding. In yet another embodiment, second portion 127 of center section 114 is also integrally formed with and substantially perpendicular to third portion 129.

Connecting tab 106 overlaps with both second positive and negative busbars 74 and 76, and is mechanically and electrically coupled to second positive busbar 74 using a fastener 104 having a bolt 138 that, when tightened into a nut (shown in FIG. 5), clamps connecting tab 106 and second positive busbar 74 together. A conducting washer 146 may assume the form of any suitable washer such as, for example, a locking washer and may be used in conjunction with fastener 104 in a well known manner to prevent loosening and maintain and distribute clamping pressure.

Bridge electrode 116 has a first end 119 and a second end 121, and includes a connecting tab 110 (shown in FIG. 4) proximate second end 121 coupled to an end terminal 126 proximate first end 119 via a center section 118 that spans between first end 119 and second end 121. In one embodiment, connecting tab 110 and end terminal 126 are each integrally formed with center section 118 to form a single piece. Connecting tab 110 overlaps with both second positive and negative busbars 74 and 76, and is mechanically coupled to these busbars with a fastener 152. Fastener 152 includes a bolt 158, a washer 166, and a nut 170 (shown in FIG. 5) that when tightened, clamps second busbars 74 and 76 and connecting tab 110 together to provide mechanical coupling. Fastener 152 is also configured to provide electrical coupling between second negative busbar 76 and connecting tab 110, and to insulate these elements from second positive busbar 74 in a manner to be described in greater detail below. End terminal 126 is electrically coupled to input contact 62 in the same manner as that described above for end terminal 122 and input contact 58.

When fastened to power busbar assembly 34, bridge electrodes 112 and 116 are each aligned as shown having center sections 114 and 118 substantially overlapped with each other. Further, second busbars 74 and 76 overlap with each other and with either connecting tab 106 or tab 110 in the region where each tab is fastened. Furthermore, the current pathway formed by bridge electrode 112 coupled between second positive busbar 74 and input contact 58 crosses with that formed by bridge electrode 116 coupled between second negative busbar 76 and input contact 62. The inductance of connector assembly 100 is thereby reduced because of: 1) the crossing of current pathways through each bridge, 2) the substantial overlapping between center sections 114 and 118, 3) the overlapping of second positive and negative busbars 74 and 76 with each other in the region where connecting tabs are fastened, and 4) the substantial overlapping of connecting tabs 106 and 110 each with both of second busbars 74 and 76.

Figure 4:
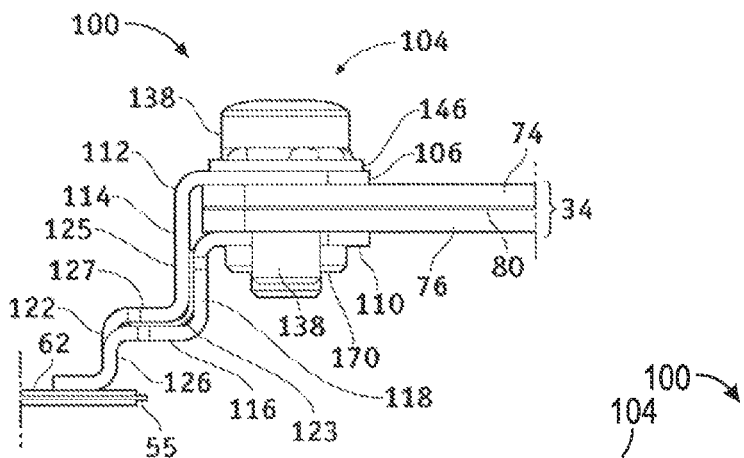
FIG. 4 is an end view of the connector assembly depicted in FIG. 3.

FIG. 4 is an end view illustrating a manner in which connector assembly 100 is integrated with second positive and negative busbars 74 and 76 and power module 55 in accordance with the exemplary embodiment. Second positive and negative busbars 74 and 76 are formed as a laminar structure having an interposed insulating layer 80. Insulating layer 80 may comprise any suitable insulating material such as a powder coating that each of busbars 74 and 76 may be individually coated with prior to forming the laminate. Alternatively as shown, insulating layer 80 may comprise a sheet of insulating material such as Mylar®. Connector assembly 100 includes bridge electrode 112 coupled between second positive busbar 74 and input contacts 58 (FIG. 3) of power module 55, and bridge electrode 116 coupled between second negative busbar 76 and input contact 62. Bridge electrodes 112 and 116 are electrically isolated from each other by central insulating layer 123. Bridge electrode 112 includes connecting tab 106 overlapping both of second positive and negative busbars 74 and 76 and electrically coupled to second positive busbar 74 and secured thereto by fastener 104. Bolt 138 passes through openings in connecting tab 106 and second positive and negative busbars 74 and 76 and is threadably tightened with a nut (shown in FIG. 5). When tightened, fastener 104 applies constant clamping pressure between connecting tab 106 and second positive busbar 74 securing these elements mechanically and maintaining electrical continuity. Fastener 104 may include conductive washer 146 that may be a locking washer to deter bolt 138 from unthreading. Connecting tab 106 and end terminal 122 are each coupled to center section 114, and in one embodiment, these three elements are integrally formed into a single piece. End terminal 122 connects to input contact 58 (FIG. 3) in a manner previously described.

Bridge electrode 116 includes connecting tab 110 that overlaps with both of second positive and negative busbars 74 and 76, and is electrically and mechanically coupled to second negative busbar 76 by fastener 152 (FIG. 3). Bolt 158 passes through openings in each of the layers of power busbar assembly 34 and is tightened with a nut 170. Connecting tab 110 and end terminal 126 are each coupled to center section 118, and in one embodiment, these three elements are integrally formed into a single piece. End terminal 126 is electrically coupled to input contact 62 as previously described in reference to end terminal 122 and input contact 58. During operation, current flows from second positive busbar 74 entering bridge electrode 112 through connecting tab 106, and flows through center section 114 and end terminal 122 to input contact 58 (FIG. 3). Current flows similarly from second negative busbar 76 through connecting tab 110, center section 118, and end terminal 126 to input contact 62. Overall busbar system inductance is reduced by: 1) the substantial overlapping of center sections 114 and 118 with each other, 2) the overlapping of second positive and negative busbars 74 and 76 with each other in the region where connecting tabs 106 and 110 are fastened, 3) the overlapping of connecting tabs 106 and 110 each with both of second busbars 74 and 76, and 4) the crossing of current pathways through bridge electrodes 112 and 116.

Figure 5:
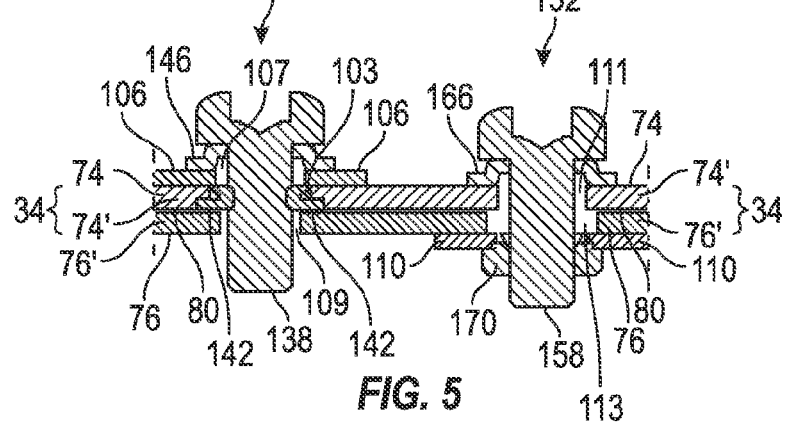
FIG. 5 is a cross-sectional illustration of the connector assembly depicted in FIGS. 3 and 4.

FIG. 5 illustrates, in cross-section, a manner in which connecting tabs 106 and 110 of connector assembly 100 are electrically and mechanically coupled to second positive and negative busbars 74 and 76 in accordance with the exemplary embodiment. Connecting tab 106 overlaps both of second positive and negative busbars 74 and 76 at busbar terminals 74' and 76' and is clamped in mechanical and electrical contact to second positive busbar terminal 74' by fastener 104. Bolt 138 passes through openings 107 and 109 in connecting tab 106 and power busbar assembly 34 at busbar terminals 74' and 76', respectively, and threads into a conductive nut 142 electrically coupled to and mechanically embedded in a side edge 103 of second positive busbar terminal 74' in opening 109. Nut 142 guides bolt 138 through the center of openings 107 and 109 maintaining these components electrically separate from second negative busbar 76. Washer 146 may be constructed of any suitable non-conducting or conducting material, and may assume any suitable form such as, for example, that of a locking washer to prevent bolt 138 from unthreading. Electrical isolation between nut 142 and second negative busbar 76 is maintained, at least in part, by insulating layer 80. A suitable moldable polymeric material such as, for example, a powder coating (not shown), may be inserted into the gaps created between openings 107 and 109 and fastener 104 to provide additional electrical insulation.

Connecting tab 110 overlaps with both of second busbars 74 and 76, and is electrically coupled with and fastened to second negative busbar terminal 76' by fastener 152. Fastener 152 includes threaded bolt 158, washer 166, and nut 170. Nut 170 comprises any suitable conducting material and may be configured to mechanically interlock with connecting tab 110 as shown in FIG. 5, to enhance mechanical and electrical coupling. Bolt 158 threads into nut 170 and is centered thereby through an opening 111 in connecting tab 110 and an opening 113 in each of second busbar terminals 74', 76', and insulating layer 80, to prevent shorting with second positive busbar 74. Openings 111 and 113 may be filled as described above with reference to openings 107 and 109 with a suitable electrically insulating material. When tightened, bolt 158 and nut 170 mechanically clamp second positive and negative busbars 74 and 76 and connecting tab 110 together, and electrically couple connecting tab 110 with second negative busbar 76. Washer 166 may comprise any suitable conducting or non-conducting material and may assume any form such as that of a locking washer. Washer 166 may comprise a non-conducting material if in direct contact with second positive busbar 74 to prevent electrical shorting between busbar 74 and the head of bolt 158. Alternatively, washer 166 may be constructed of a conducting material if busbar 74 is insulated therefrom by, for example, a powder coating or other suitable non-conducting film (not shown).

Accordingly, the various embodiments of the present invention described herein provide a low inductance connector assembly for a busbar system. The busbar system interconnects the various terminals of one or more two-terminal devices such as a capacitor assembly and/or a DC source, to the input contacts of another two-terminal device such as a power module. The connector assembly electrically couples positive and negative busbars of a primary busbar system to input contacting terminals of the power module. The assembly includes a pair of substantially overlapping, conductive, and electrically segregated bridge electrodes, each electrode configured to form a current pathway between a positive or negative busbar and a power module input contact of like polarity. Both bridge electrodes have a connecting tab that overlaps both positive and negative busbars, and an end terminal for coupling to power module input contacts. Each bridge is configured to form a substantially overlapping and conducting pathway between a busbar and a power module input contact that crosses the pathway formed by the other bridge. The contribution to overall busbar system inductance by the connector assembly is reduced as a result of: 1) the overlapping of connecting tabs with both positive and negative busbar electrodes, 2) the overlapping of positive and negative busbar electrodes with each other in the region where connecting tabs are fastened, 3) the substantial mutual overlapping of the bridge electrodes, and 4) the crossed current pathways that the bridge electrodes provide together.

The preceding description refers to elements or nodes or features being "connected" or "coupled" together. As used herein, unless expressly stated otherwise, "connected" means that one element/node/feature is directly joined to (or directly communicates with) another element, node or other feature in a mechanical, logical, electrical or other appropriate sense. Likewise, unless expressly stated otherwise, "coupled" means that one element/node/feature is directly or indirectly joined to (or directly or indirectly communicates with) another element/node/feature in a mechanical, logical, electrical or other appropriate sense. The term "exemplary" is used in the sense of "example," rather than "model." Further, although the figures may depict example arrangements of elements, additional intervening elements, devices, features, or components may be present in a practical embodiment of the invention. Furthermore, the term "integrally formed" or "integrally connected" means that a first element/node/feature extends or transitions in a continuous manner from a second element/node/feature and not as two separate and distinguishable elements.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A connector assembly comprising:
   a first busbar and a second busbar on a busbar assembly, the first busbar having a first terminal and the second busbar having a second terminal;
   a power module with a first contact and a second contact, wherein the first terminal resides proximate the first contact and the second terminal resides proximate the second contact;
   a first bridge having a first end and a second end, the first bridge comprising:
      a first connecting tab electrically contacted to the first terminal proximate the first end of the first bridge and overlapping with the first and second busbars;
      a first end terminal electrically contacted to the second contact proximate the second end of the first bridge;
      a first center section coupled between the first connecting tab and the first end terminal; and
      a first fastener configured to clamp and electrically couple the first connecting tab and the first busbar together, and wherein the first connecting tab, the first center section, and the first end terminal are integrally formed; and
   a second bridge having a first end and a second end, the second bridge comprising:

a second connecting tab electrically contacted to the second terminal proximate the second end of the second bridge and overlapping with the first and second busbars;

a second end terminal electrically contacted to the first contact proximate the first end of the second bridge; and a second center section coupled between the second connecting tab and the second end terminal; and a second fastener configured to clamp the second connecting tab and the first and second busbars together, and to electrically couple the second busbar to the second connecting tab, and wherein the second connecting tab, the second center section, and the second end terminal are integrally formed, and wherein the first and second center sections are configured to substantially overlap each other.

2. A busbar connector comprising:

a first busbar having a first terminal and a second busbar having a second terminal;

a power module with a first contact residing proximate to the first terminal and a second contact residing proximate to the second terminal;

a first bridge having a first end and a second end, the first bridge comprising:

a first connecting tab coupled to the first terminal proximate the first end of the first bridge and overlapping with the first and second busbars;

a first end terminal coupled to the second contact proximate the second end of the first bridge; and a first center section coupled between the first connecting tab and the first end terminal; and a second bridge having a first end and a second end, the second bridge comprising:

a second connecting tab coupled to the second terminal proximate the second end of the second bridge and overlapping with the first and second busbars;

a second end terminal coupled to the first contact proximate the first end of the second bridge;

a second center section coupled between the second connecting tab and the second end terminal, and wherein the first and second center sections are configured to substantially overlap each other;

a first fastener that clamps and electrically couples the first connecting tab and the first busbar together; and a second fastener that clamps the second connecting tab and the first and second busbars together, the second fastener configured to electrically couple the second busbar and the second connecting tab.

3. An assembly according to claim 2, wherein the first connecting tab, the first center section, and the first end terminal are integrally formed.

4. An assembly according to claim 2, wherein the first center section has a first portion and a second portion, and the first portion is substantially orthogonal to the second portion and the first connecting tab.

5. An assembly according to claim 4, wherein the second portion is substantially orthogonal to the first end terminal.

* * * * *